US011886235B2

(12) United States Patent
Garelli et al.

(10) Patent No.: US 11,886,235 B2
(45) Date of Patent: Jan. 30, 2024

(54) ELECTRONIC DEVICE WITH A THERMAL AND EMI SHIELD

(71) Applicant: Apple Inc., Cupertino, CA (US)

(72) Inventors: Adam T. Garelli, Santa Clara, CA (US); Paul X. Wang, Cupertino, CA (US); Pooja B. Patel, San Francisco, CA (US); Nicholas A. Rundle, San Jose, CA (US); Eric R. Prather, Portola Valley, CA (US); Simon S. Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 583 days.

(21) Appl. No.: 17/112,904

(22) Filed: Dec. 4, 2020

(65) Prior Publication Data

US 2022/0050513 A1      Feb. 17, 2022

Related U.S. Application Data

(60) Provisional application No. 63/064,372, filed on Aug. 11, 2020.

(51) Int. Cl.
| | |
|---|---|
| *G06F 1/16* | (2006.01) |
| *H05K 7/20* | (2006.01) |
| *G06F 1/18* | (2006.01) |
| *G06F 1/20* | (2006.01) |
| *H05K 9/00* | (2006.01) |

(52) U.S. Cl.
CPC .......... *G06F 1/1601* (2013.01); *G06F 1/1656* (2013.01); *H05K 7/20145* (2013.01); *H05K 7/20154* (2013.01); *H05K 9/0037* (2013.01); *H05K 9/0041* (2013.01); *G06F 1/182* (2013.01); *G06F 1/20* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 6,776,706 B2 | 8/2004 | Kipka et al. | |
| 7,394,653 B2 | 7/2008 | Cheng et al. | |
| 7,515,413 B1 | 4/2009 | Curtis | |

(Continued)

FOREIGN PATENT DOCUMENTS

JP            4896359 B2       3/2012

*Primary Examiner* — Jerry Wu
(74) *Attorney, Agent, or Firm* — BAKERHOSTETLER

(57) ABSTRACT

An electronic device is disclosed. The electronic device includes a shield that provides thermal and electromagnetic interference ("EMI") shielding benefits. The shield is secured with fan assemblies by airtight seals to prevent air leakage and promote a pressured volume when the fan assemblies are running. Further, the shield can direct airflow from the fan assemblies to one or more thermally conductive components, where the airflow can convectively cool the thermally conductive components and exit the electronic device. The shield is made from a metal, and when the shield covers a circuit board, the shield protects an EMI barrier for integrated circuits located on the circuit board. Moreover, the shield can provide a single-piece, monolithic body that provides advantages over multiple shields, such as eliminating gaps in the shield for air leakage and EMI intrusion, increasing air circulation efficiency, and decreasing costs.

20 Claims, 13 Drawing Sheets

(56) References Cited

U.S. PATENT DOCUMENTS

| | | |
|---|---|---|
| 7,633,751 B2 | 12/2009 | Shinotou et al. |
| 7,800,706 B2 | 9/2010 | Kim et al. |
| 8,934,235 B2 * | 1/2015 | Rubenstein ......... F28D 15/0275 |
| | | 361/679.48 |
| 2009/0253365 A1 | 10/2009 | Gagnon et al. |
| 2012/0327581 A1 | 12/2012 | Pais et al. |
| 2015/0261268 A1 * | 9/2015 | Gong ..................... G06F 1/203 |
| | | 361/679.5 |
| 2017/0273214 A1 | 9/2017 | Casparian et al. |

* cited by examiner

ELECTRONIC DEVICE WITH A THERMAL AND EMI SHIELD

CROSS-REFERENCE TO RELATED APPLICATIONS

The present application claims the benefit of U.S. Provisional Application No. 63/064,372, entitled "ELECTRONIC DEVICE WITH A THERMAL AND EMI SHIELD," filed Aug. 11, 2020, the content of which is incorporated herein by reference in its entirety for all purposes.

FIELD

The following description relates to electronic devices. In particular, the following description relates to shields integrated with electronic devices. Shields described herein are sealed with fan assemblies, and form a pressurized enclosure that directs air from the fan assemblies, thereby enhancing thermal energy dissipation in an electronic device. Additionally, shields described herein are made from metal and when covering components that generate electromagnetic energy, the shields can block the electromagnetic energy from interfering with other components of the electronic device.

BACKGROUND

Electronic devices may include multiple cans, each of which designed to cover a respective component of the electronic device. The use of discrete cans, however, form a seam (or seams) between adjacent cans through which energy can pass. The energy may include thermal energy and/or electromagnetic energy. Sufficient thermal energy leaking through the seam(s) can damage, or at least reduce performance, of other components, while electromagnetic energy leaking through the seam(s) can create electromagnetic interference ("EMI") that affects the performance of components.

SUMMARY

In one aspect, an electronic device is disclosed. The electronic device may include a display. The electronic device may further include a housing coupled with the display. The housing may define an internal volume and a grill. The electronic device may further include components disposed within the internal volume. The components may include a first fan assembly that includes a first fan housing. The components may further include a second fan assembly that includes a second fan housing. The components may further include a circuit board that carries an integrated circuit. The components may further include a shield covering the circuit board and coupled with the first fan housing and the second fan housing. In some embodiments, the shield i) blocks electromagnetic interference from the integrated circuit and ii) directs airflow from the first fan assembly and the second fan assembly through the grill.

In another aspect, an electronic device is disclosed. The electronic device may include a display. The electronic device may further include a housing coupled with the display. The housing may define an internal volume and a grill that defines openings. The electronic device may further include a first sealing structure that covers a first portion of the grill. The electronic device may further include a second sealing structure that covers a second portion of the grill. In some embodiments, the openings, based upon the first sealing structure and the second sealing structure, define a first air intake section, a second air intake section separate from the first air intake section, and an air output section separate from the first air intake section and the second air intake section. The electronic device may further include components disposed within the internal volume. The components may include a first fan assembly configured to receive air from the first air intake section. The first fan assembly may include a first fan housing. The components may further include a second fan assembly configured to receive air from the second air intake section. The second fan assembly may include a second fan housing. The components may further include a shield coupled with the first fan housing and the second fan housing. In some embodiments, the shield directs airflow from the first fan assembly and the second fan assembly through the air output section.

In another aspect, an electronic device is disclosed. The electronic device may include a display. The electronic device may further include a housing coupled with the display. The housing may define an internal volume and a grill that defines a first air intake section and a second air intake section. The electronic device may further include components disposed within the internal volume. The components may include a first fan assembly configured to receive air from the first air intake section. The first fan assembly may include a first fan assembly housing. The components may further include a second fan assembly configured to receive air from the second air intake section. The second fan assembly may include a second fan assembly housing. The components may further include a circuit board positioned between the first fan assembly and the second fan assembly. The components may further include a shield coupled with the first fan assembly housing and the second fan assembly housing. The shield may define an indentation. The components may further include a flexible circuit connected with the display and the circuit board. In some embodiments, the flexible circuit passes through the shield at the indentation. The components may further include a sealing structure secured with the flexible circuit and the shield at the indentation.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
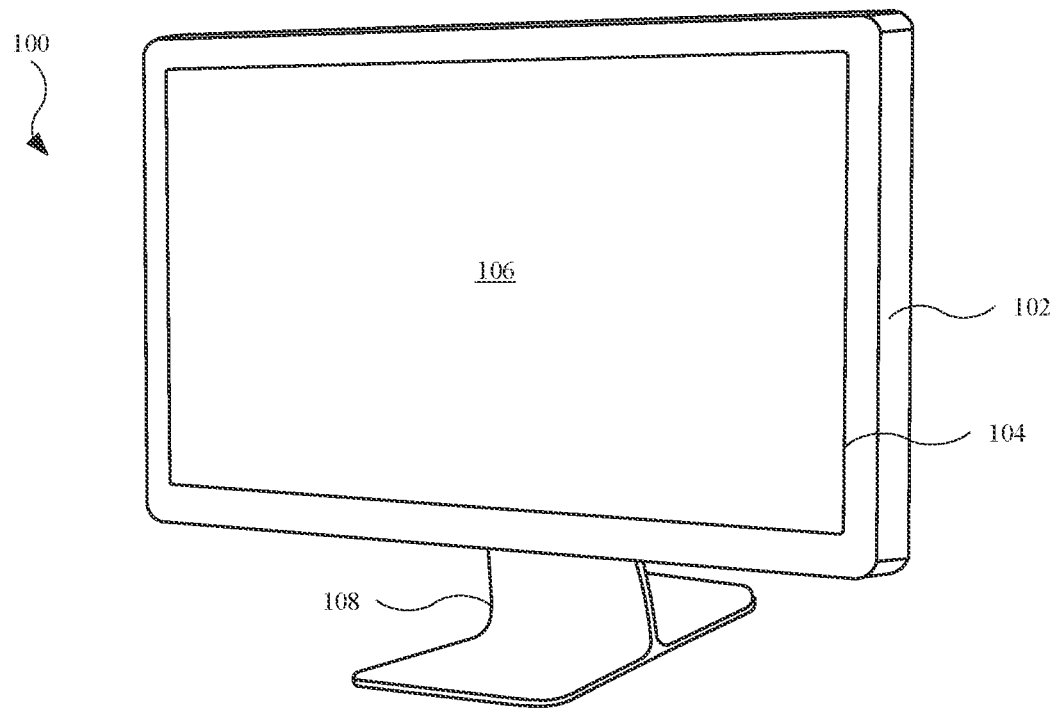
FIG. 1 illustrates a front isometric view of an embodiment of an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an electronic device with enhancements to a shield of the electronic device. The shield may include a metallic cover designed to provide the electronic device with thermal and electromagnetic shielding benefits. In some exemplary embodiments, an electronic device described herein includes a display and a housing secured to the display. In order to dissipate thermal energy, the electronic device includes one or more fan assemblies. When integrated with the electronic device, the shield can be secured with the housing and the fan assemblies (e.g., respective fan housings of the fan assemblies) by airtight seals, resulting in a continuous, pressurized internal air volume when fan assemblies drive airflow. As a result, the air volume (defined by the shield, the fan assemblies, and the housing) is generally controlled. Moreover, based upon the airtight seals, airflow generated by the fan assemblies will not leak into other areas of the housing. Accordingly, the (heated) airflow will not increase the temperature of the electronic device in other locations. In this manner, when the fan assemblies drive air to cool heat-generating components and other thermally conductive components, the air (now heated) can be controlled/directed by the shield to flow out of the electronic device in a particular location, such as a grill formed in the enclosure. Using a shield described herein may increase thermal energy dissipation.

The metallic nature of the shield provides additional benefits. In some exemplary embodiments, the electronic device includes a circuit board on which several integrated circuits are located. When the circuit board is covered by the shield, the shield can block transmission of electromagnetic interference ("EMI") generated by the integrated circuits. As a result, other components (including components internal and external to the electronic device) are not affected by the EMI. Alternatively, the integrated circuits can be protected by the shield from EMI generated by other components in the electronic device, such as wireless communication integrated circuits. As a result, the integrated circuits located on the circuit board are not subject to decreased performance due to EMI.

Contrary to traditional shielding techniques that employ multiple shield designed to protect a single component, the shields described herein are single-piece shields designed to cover multiple components. The single-piece nature not only reduces the number of required parts, but also enhances the performance of electronic devices reducing the number of air leak locations and EMI ingress locations. Moreover, the single-piece nature of the shield provides a larger thermally conductive body, which promotes heat transfer away from heated parts and components. Further, a shield formed by a single body may decrease manufacturing times and associated costs to assemble the electronic device.

These and other embodiments are discussed below with reference to FIGS. 1-17. However, those skilled in the art will readily appreciate that the detailed description given herein with respect to these Figures is for explanatory purposes only and should not be construed as limiting.

FIG. 1 illustrates a front isometric view of an embodiment of an electronic device 100. In some embodiments, electronic device 100 is a laptop computing device. In other embodiments, electronic device 100 is a standalone display. In the embodiment shown in FIG. 1, electronic device 100 is a desktop computing device. As shown, electronic device 100 include a housing 102, or enclosure, that provides an internal volume or space in which multiple components are disposed, such as processing circuits (integrated circuits, central processing units, graphics processing units), memory circuits, audio speakers, microphones, batteries, fan assemblies, and flexible circuitry to couple the components together.

Electronic device 100 may further include a display 104 coupled with housing 102. Display 104 may include a liquid crystal display or a light-emitting diode (including an organic light-emitting diode) display, as non-limiting examples. Display 104 is designed to present visual information in the form of textual information, still images, and/or motion picture (video) images. Electronic device 100 may further include a transparent layer 106 that covers display 104. Transparent layer 106 may generally include any rigid transparent substrate, such as glass, plastic, or sapphire, as non-limiting examples.

In order to adjust the position of display 104, electronic device 100 includes a stand 108 coupled with housing 102. Housing 102 and stand 108 can be rotationally coupled together, thereby allowing housing 102 (and display 104) to rotate to different positions, based upon user preferences.

Figure 2:
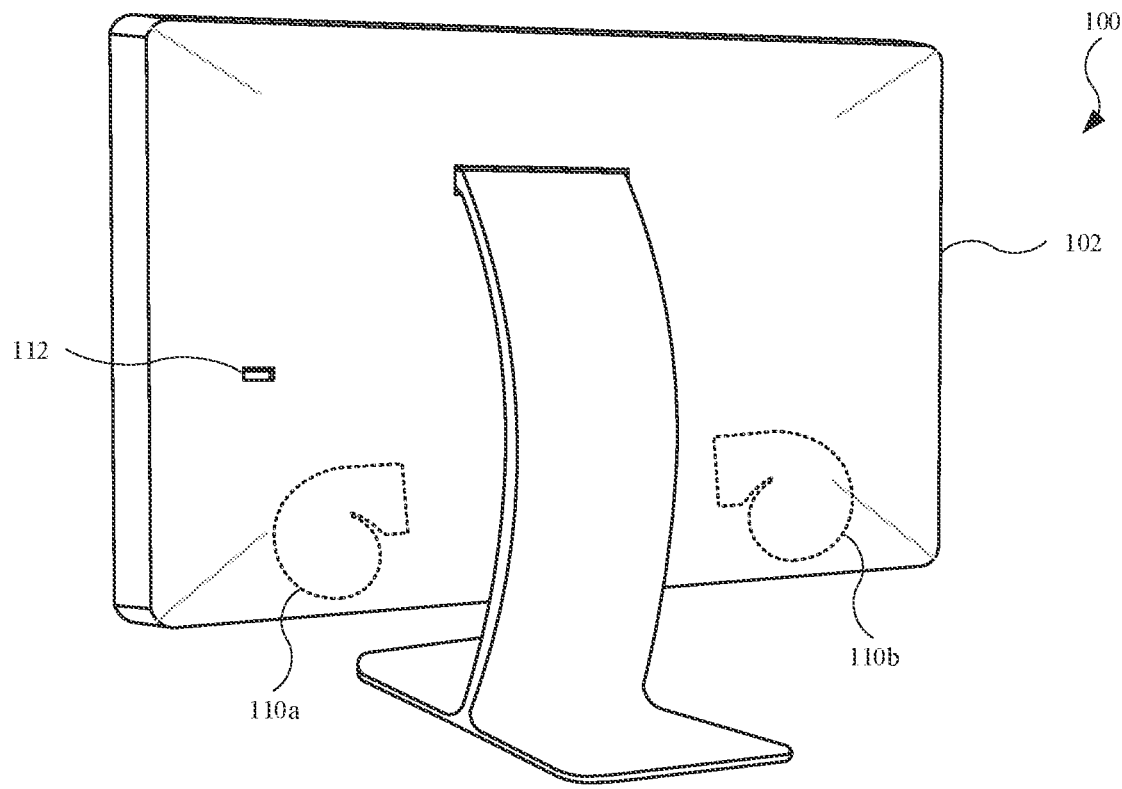
FIG. 2 illustrates a rear isometric view of the electronic device shown in FIG. 1, showing additional features of the electronic device.

FIG. 2 illustrates a rear isometric view of electronic device 100 shown in FIG. 1, showing additional features of electronic device 100. As shown, electronic device 100 includes a fan assembly 110a and a fan assembly 110b. Fan assemblies 110a and 110b are designed to drive air within the internal volume defined by housing 102. In this manner, fan assemblies 110a and 110b may cool (by convention) components within electronic device 100 that generate thermal energy during use and/or bodies designed to absorb thermal energy. In this regard, fan assemblies 110a and 110b, during operation, can force ambient air (external to electronic device 100) into housing 102, and subsequently drive the air (once heated) out of housing 102 in a desired manner. This will be shown and described further.

Additionally, electronic device 100 may include port 112 (representative of one or more ports). Port 112 is designed to provide a connection/communication point between electronic device 100 and other devices (not shown in FIG. 2). Accordingly, port 112 may include an industry standard connection, such as Universal Serial Bus ("USB"), including USB-C, connection or a THUNDERBOLT® connection, as non-limiting examples.

Figure 3:
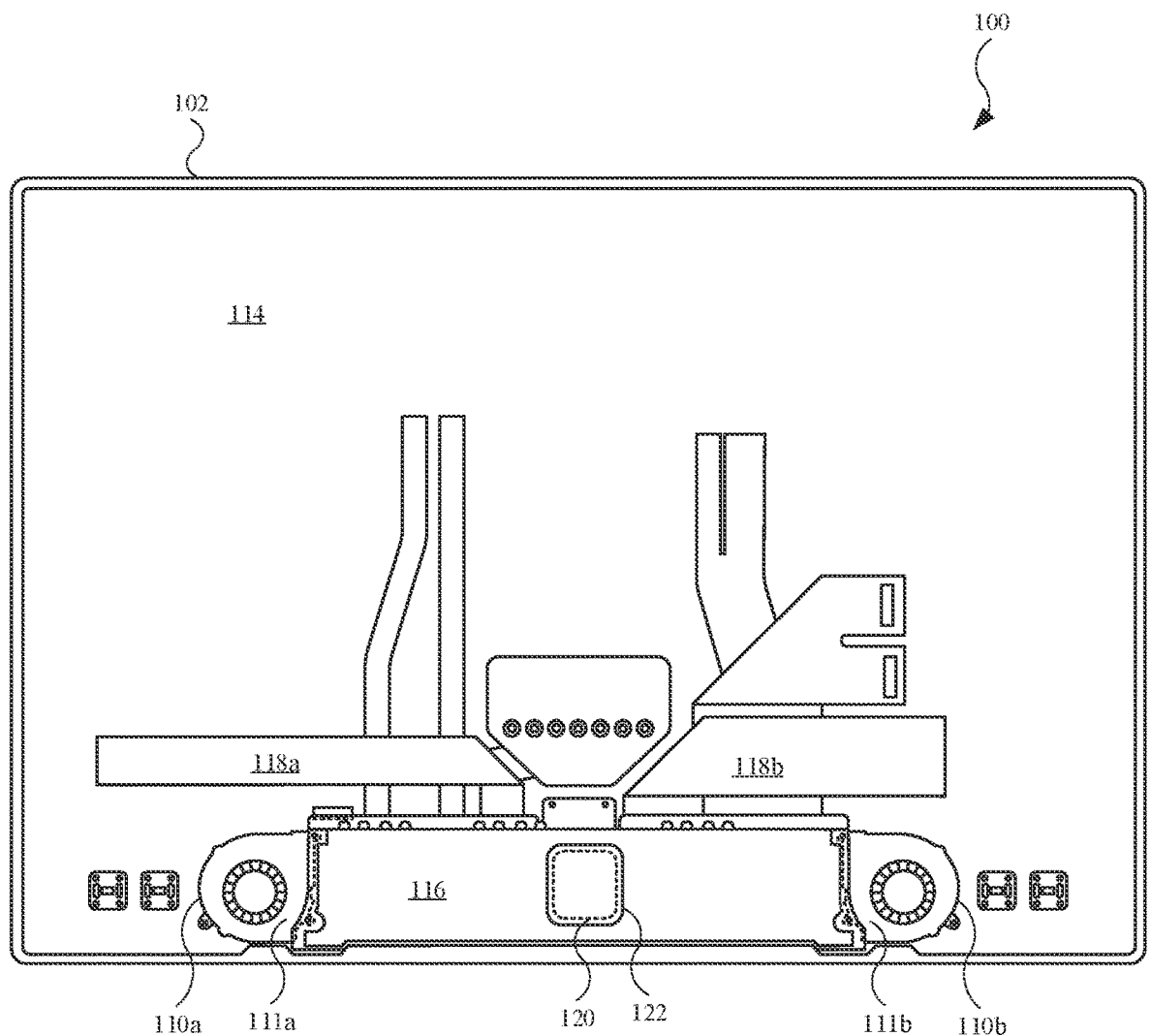
FIG. 3 illustrates a plan view of the electronic device, showing additional internal features of the electronic device.

FIG. 3 illustrates a plan view of electronic device 100, showing additional internal features of electronic device 100. The various internal features are located in an internal volume 114 defined by housing 102. For purposes of illustration, display 104 and transparent layer 106 (shown in FIG. 1) are removed. As shown, electronic device 100 includes a shield 116. Shield 116 can provide electronic device 100 with several benefits, such as increased thermal energy dissipation efficiency and reduced electromagnetic interference ("EMI") transmission. Shield 116 can be coupled with fan assemblies 110a and 110b, and in particular, shield 116 is coupled with a fan housing 111a and a fan housing 111b of fan assemblies 110a and 110b, respectively, by sealing structures, including airtight sealing structures. Each of fan housings 111a 111b may be referred to as a fan assembly housing. Additionally, shield 116 is coupled with housing 102, by sealing structures, including airtight sealing structures. Additionally, flexible circuits, such as a flexible circuit 118a and a flexible circuit 118b, are coupled with, and surrounded by, sealing structures, including airtight sealing structures. The sealing structures will be shown and described below. Fan assemblies 110a and fan assemblies 110b are positioned such that ambient air drawn in by fan assemblies 110a and 110b is directed through the air volume enclosed by housing 102, fan assemblies 110a and 110b, and shield 116. As a result, a continuous air volume enclosed by housing 102, fan assemblies 110a and 110b, and shield 116 is relatively airtight, as air leak paths between the aforementioned components is limited or prevents, and airflow into and out of the air volume is limited to predefined locations.

Additionally, electronic device 100 may include a circuit board (not shown in FIG. 3) covered by shield 116, with one or more heat-generated components (e.g., integrated circuits) located on the circuit board. Also, electronic device 100 may further include a thermally conductive assembly (not shown in FIG. 3) covered by shield 116, which may include heat sinks and/or fin stacks. As a result, the airflow from fan assemblies 110a and 110b is directed over the heated bodies (e.g., integrated circuits and thermally conductive assembly). Moreover, the airtight sealing structures provide a more efficient cooling process by not only focusing the airflow (cool air) over the heated bodies, but also by limiting or preventing the air, when heated, from extending into other locations of internal volume 114. Regarding the latter, the heated air (carrying thermal energy) can be directed out of housing 102 via a grill (not shown in FIG. 3). Also, in some instances, a connector (not shown in FIG. 3) is sufficiently large enough to otherwise contact shield 116. In this manner, shield 116 may include an opening 120 (shown as a dotted line) to accommodate the connector. In order to limit or prevent air leakage through opening 120, a cover 122 is applied to shield 116 at opening 120. Cover 122 may include tape, including an electrically conductive tape.

In addition to controlling the airflow from fan assemblies 110a and 110b, shield 116 may include a metal (e.g., sheet metal, stainless steel, or an alloy with stainless steel, as non-limiting examples) and accordingly, can block, or provide a barrier, for electromagnetic interference ("EMI"). For example, integrated circuits covered by shield 116 may generate EMI that can otherwise interfere with other components within internal volume 114 or external to electronic device 100. However, EMI is prevented from passing through shield 116. Alternatively, shield 116 can block EMI transmission so as to prevent integrated circuits located on the circuit board from exposure to EMI. Also, due in part to its electrically conductive properties, cover 122 can also block EMI transmission.

Accordingly, shield 116 provides electronic device 100 with thermal and EMI benefits. These benefits are further enhanced by shield 116 being a single-piece body, as opposed to multiple discrete structures. For example, as shown, shield 116 includes a unitary structure that extends from fan assembly 110a to fan assembly 110b, including some overlap onto fan assemblies 110a and 110b. As a result of the single-piece nature, shield 116 provides fewer air leaking and EMI leaking locations, as opposed to an assembly of shields. Moreover, shield 116 is easier to install and may require fewer connection points, and accordingly, may reduce the overall manufacturing costs of electronic device 100.

Figure 4:
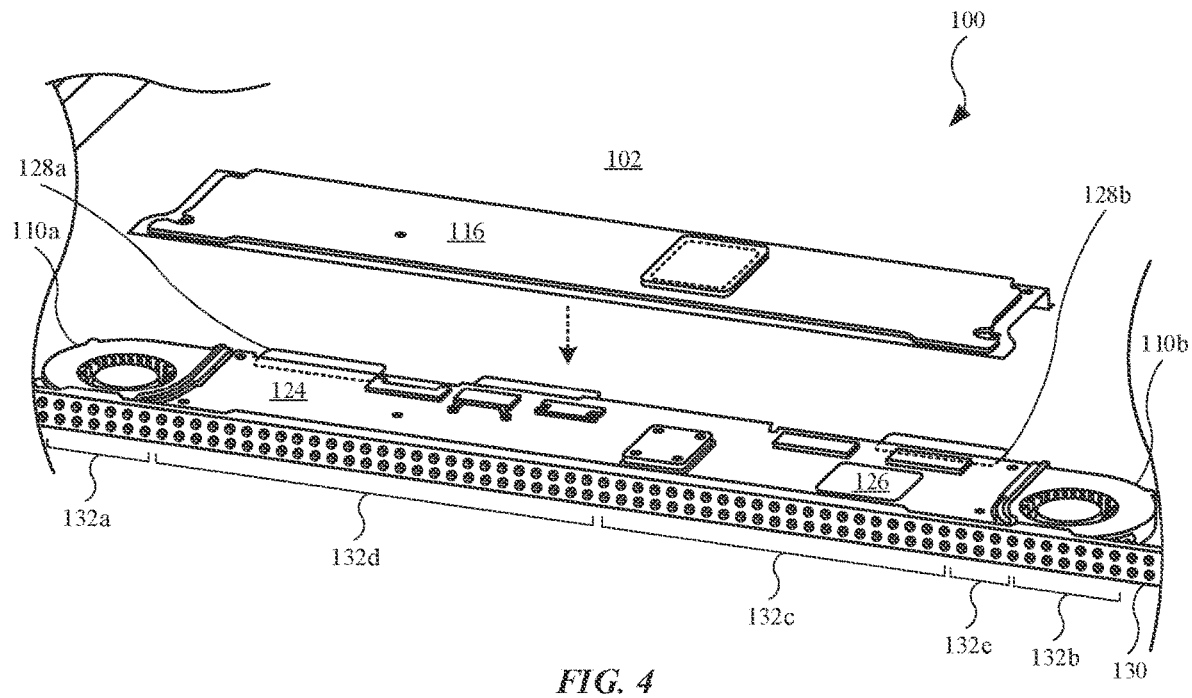
FIG. 4 illustrates an exploded view of the electronic device, showing the shield prior to assembly.

FIG. 4 illustrates an exploded view of electronic device 100, showing shield 116 prior to assembly. As shown, electronic device 100 includes a circuit board 124 positioned between fan assemblies 110a and 110b. Circuit board 124 may carry a number of integrated circuits, such as an integrated circuit 126, each of which providing processing capabilities for electronic device 100, while also generating thermal energy during operation.

In some embodiments, housing 102 is an anodized aluminum. As a result, housing 102, while metal, provides a substantially reduced electrical grounding pathway. In this regard, housing 102 includes an etch region 128a and an etch region 128b, each of which representing a material removal in housing 102 based upon laser etching, as a non-limiting example. When shield 116 is secured with housing 102, shield 116 is in contact with etch region 128a and etch region 128b, and housing 102 provides an electrical grounding path for shield 116, as etch region 128*a* and etch region 128*b* each provides a contact location for electrical grounding.

Electronic device 100 further includes a grill 130 formed in housing 102. Grill 130 may include openings, or through holes. Further, while grill 130 may form a consistent pattern in housing 102, grill 130 can be partitioned into multiple sections, with each section defined by airflow passing through grill 130. For example, grill 130 includes a section 132*a* and a section 132*b*. During operations, fan assemblies 110*a* and 110*b* can force ambient/environmental air into electronic device 100 through sections 132*a* and 132*b*, respectively. Accordingly, sections 132*a* and 132*b* may each be referred to as an air intake section. The air is driven by fan assemblies 110*a* and 110*b*, where the air is forced over circuit board 124, including integrated circuit 126, as well as other heated structures (which will be shown and described below). As a result, the air convectively cools integrated circuit 126 and the heated structures. Grill 130 further includes a section 132*c*. When the air passes over the heated bodies, the temperature of the air increases by acquiring thermal energy. In this regard, the heated air can exit electronic device 100 through section 132*c*. Accordingly, section 132*c* may be referred to as an air output section. Based on sections 132*a*, 132*b*, and 132*c*, ambient air can flow into electronic device 100, cool components of electronic device 100, and exit electronic device 100. Due in part to shield 116, the airflow by fan assemblies 110*a* and 110*b* is limited or prevented from extending to other regions of housing 102, thereby preventing unwanted temperature increases throughout housing 102.

While some sections of grill 130 permit the free flow of air, other sections of grill 130 are covered to prevent airflow. For example, grill 130 includes a section 132*d* and a section 132*e*. In order to bias the airflow from fan assembly 110*a* to a particular location, section 132*d* can be covered by a sealing structure (not shown in FIG. 4), including an airtight sealing structure. Accordingly, the airflow from fan assembly 110*a* will not exit housing 102 through section 132*d*, but rather through 132*c*. As a result, the air driven into housing 102 can flow over the heated bodies that are closer to fan assembly 110*b* and positioned above section 132*c* of grill 130. In order to prevent unwanted air circulation of heated air back into housing 102, section 132*e* is also covered by a sealing structure, including an airtight sealing structure. As a result, fan assembly 110*b* is less likely to drive, or prevented from driving, heated air exiting through section 132*c* of grill 130 back into housing 102 through section 132*b* of grill 130. Accordingly, sections 132*a*, 132*b*, and 132*c* may each be referred to as an uncovered section in which air is permitted to pass into or out of housing 102 through sections 132*a*, 132*b*, and 132*c*, while sections 132*d* and 132*e* may each be referred to as a covered section in which air is blocked from passing into or out of housing 102 through sections 132*d* and 132*e*.

Figure 5:
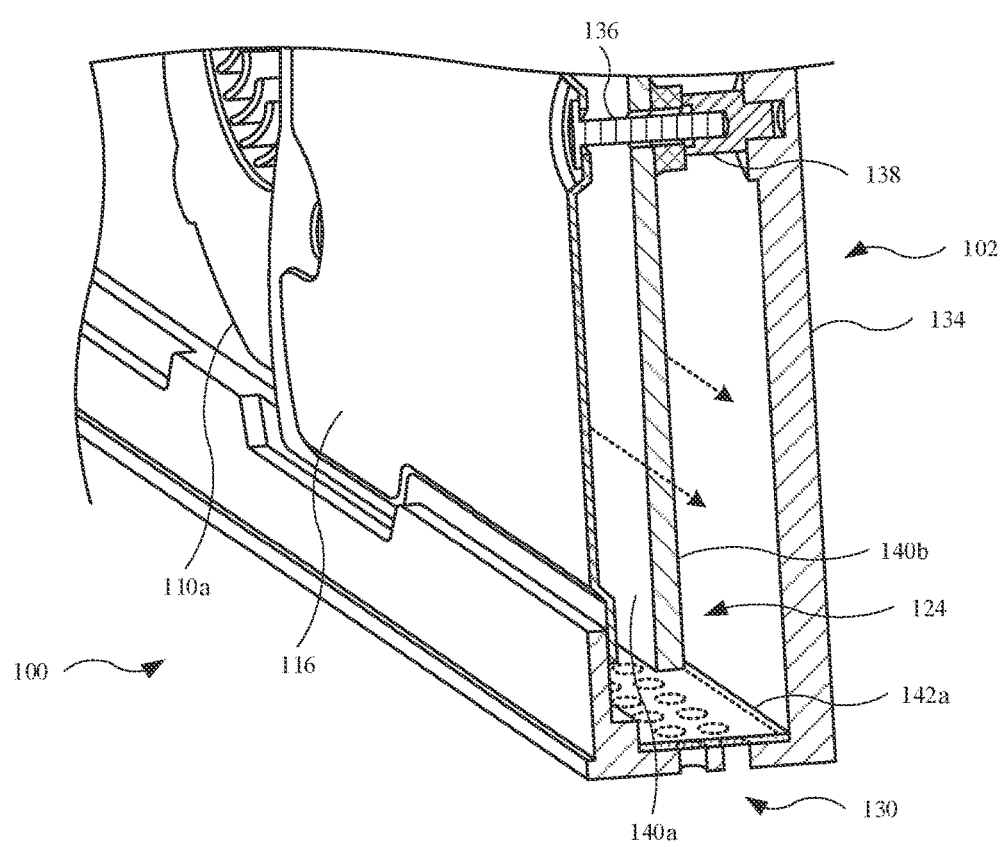
FIG. 5 illustrates a partial cross sectional view of the electronic device, showing the circuit board positioned between the housing and the shield.

FIG. 5 illustrates a partial cross sectional view of electronic device 100, showing circuit board 124 positioned between housing 102 and shield 116. As shown, shield 116 is secured with a housing wall 134, or simply wall, of housing 102 by a fastener 136. Also, in order to separate circuit board 124 from housing wall 134, electronic device 100 further includes a standoff 138. Fastener 136 may couple with standoff 138. In some embodiments, fastener 136 and standoff 138 are each made from an electrically conductive material, such as a metal (e.g., copper or steel). In this regard, shield 116 and circuit board 124 may be electrically grounded to housing 102 by way of fastener 136 and standoff 138. Although not shown, several fasteners and standoffs may be incorporated into electronic device 100 in a similar manner.

As shown, circuit board 124 is separated from not only housing wall 134, but also shield 116. As a result, air (represented by an arrow) driven by fan assembly 110*a* passes over both a surface 140*a* and a surface 140*b* of circuit board 124, and heated components located on surfaces 140*a* and 140*b* can be convectively cooled by fan assembly 110*a*. Fan assembly 110*b* (not shown in FIG. 5) can also drive air over surfaces 140*a* and 140*b*. Further, a sealing structure 142*a* covers a portion of grill 130. Sealing structure 142*a* may include an airtight sealing structure with an adhesive feature to secure with grill 130.

Figure 6:
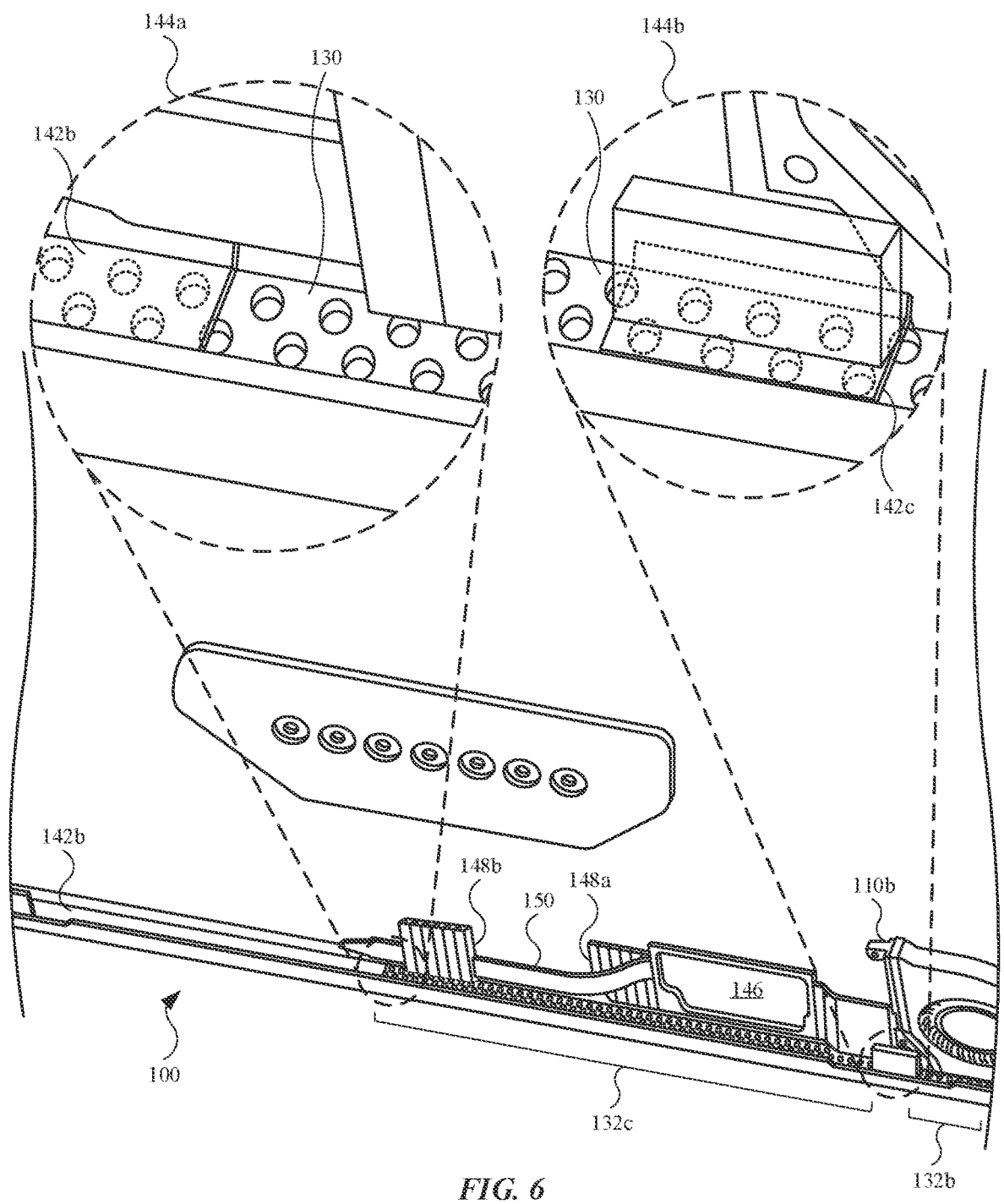
FIG. 6 illustrates an isometric view of the electronic device, showing additional sealing structures covering the grill.

FIG. 6 illustrates an isometric view of electronic device 100, showing additional sealing structures covering grill 130. As shown in an enlarged view 144*a*, a sealing structure 142*b* partially covers grill 130, and in an enlarged view 144*b*, a sealing structure 142*c* partially covers grill 130. Sealing structures 142*b* and 142*c* may include any features previously described for sealing structure 142*a* (shown in FIG. 5). Accordingly, sealing structures 142*b* and 142*c* may include airtight sealing structures. Based upon the placement of sealing structures 142*b* and 142*c*, section 132*b* (an air intake location) is defined. Further, based upon the placement of sealing structure 142*c*, section 132*c* (an air output location) at least partially defined.

Also, electronic device 100 includes a thermally conductive assembly. The thermally conductive assembly includes one or more thermally conductive components designed to draw heat away from one or more heat-generating components (not shown in FIG. 6). As shown, the thermally conductive assembly includes a heat sink 146, as well as a fin stack 148*a* and a fin stack 148*b*. The heat sink 146 draw thermal energy, by thermal conduction, from one or more heat-generating components located on circuit board 124, such as integrated circuit 126 (shown in FIG. 4). The thermally conductive assembly further includes a thermal conduit 150 that can provide a thermal path for thermal energy received by heat sink 146. Thermal conduit 150 can transfer thermal energy from heat sink 146 to fin stacks 148*a* and 148*b*.

Also, the thermally conductive components of the thermally conductive assembly are generally aligned with section 132*c*, and vice versa. In this regard, airflow from fan assemblies 110*a* and 110*b*, and in particular, fan assembly 110*a* (shown in FIG. 4), is biased to the thermally conductive assembly, as the sealing structure 142*b* covers grill 130 in a location where the airflow would otherwise exit electronic device 100. As a result, the amount of airflow over thermally conductive assembly increases, thereby increasing the cooling efficiency within electronic device 100. This may enhance the overall user experience of electronic device 100, as the components of electronic device 100 are less susceptible to damage through overheating, and the processing components (not shown in FIG. 6) may not sufficiently increase in temperature so as to cause the processing components to reduce their processing capabilities until the temperature of the processing components decrease.

Figure 7:
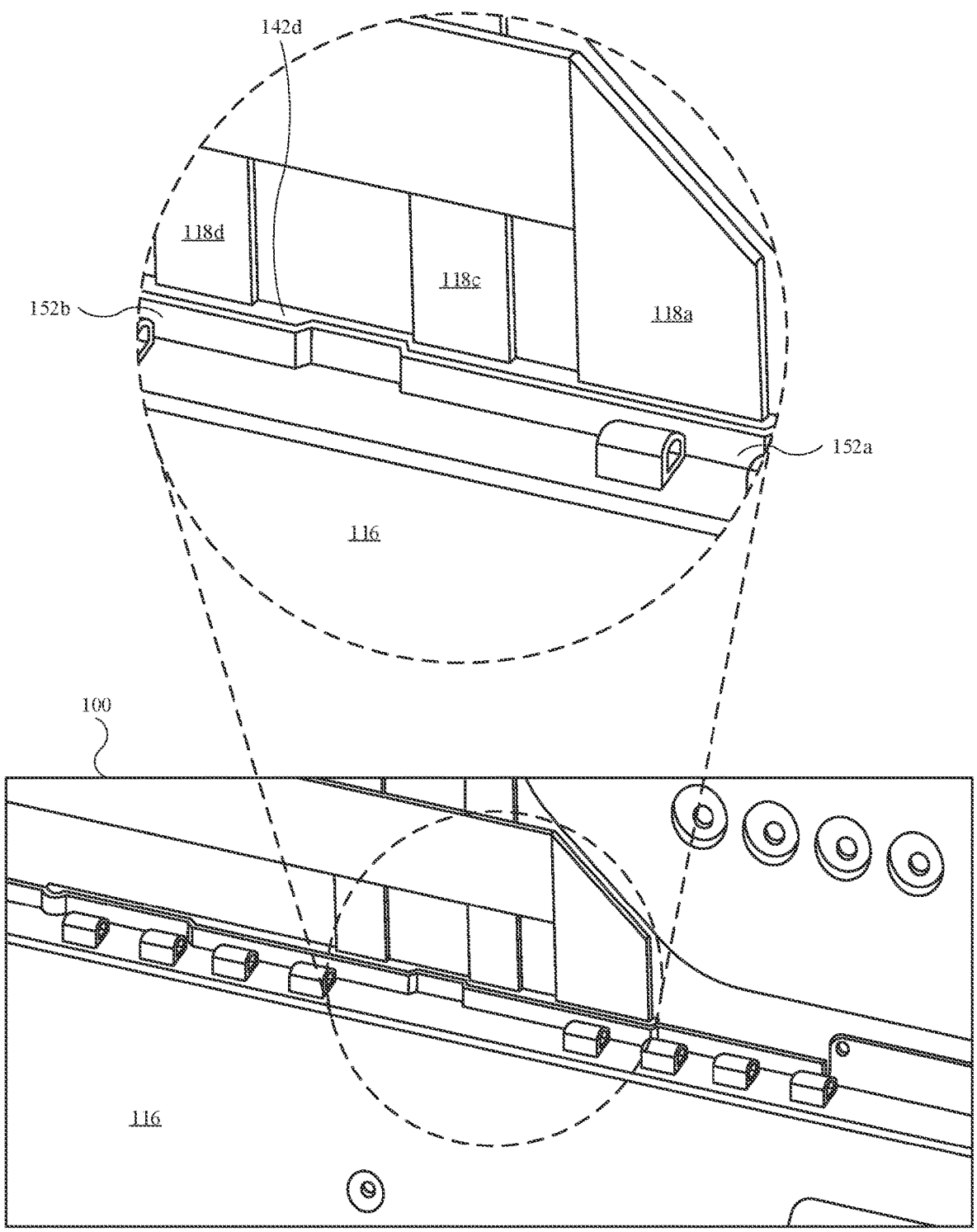
FIG. 7 illustrates an enlarged isometric view of the electronic device, showing modifications to the shield.
Figure 8:
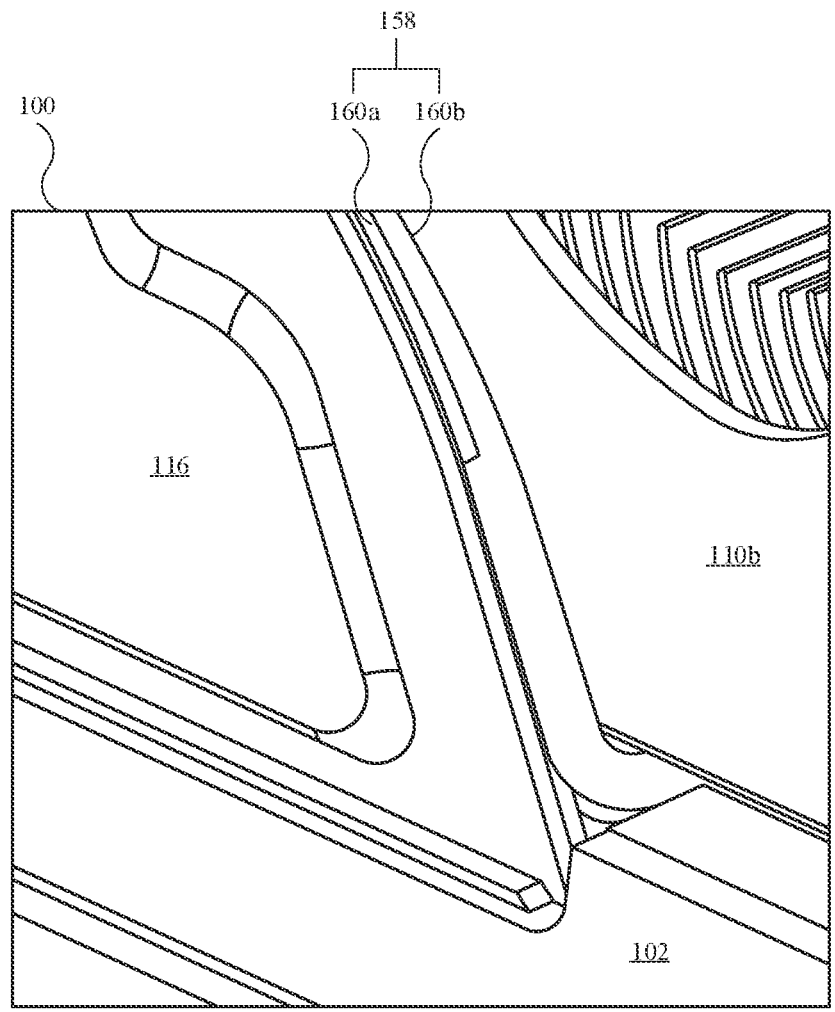
FIG. 8 illustrates an enlarged isometric view of the electronic device, showing additional seals between the shield and the fan assembly.

FIGS. 7 and 8 show additional sealing structures used to form airtight seals between shield 116 and housing 102, as well as between shield 116 and other components. FIG. 7 illustrates an enlarged isometric view of electronic device 100, showing modifications to shield 116. As shown in the enlarged view, shield 116 includes an indentation 152*a* and an indentation 152*b*. Indentations 152*a* and 152*b* defined a bend formed in shield 116 to accommodate flexible circuits in electronic device 100. For example, indentation 152*a* provides additional space for flexible circuit 118*a* and a flexible circuit 118*c* to pass under shield 116 to electrically couple with circuit board 124 (shown in FIG. 4). Indentation 152*b* provides additional space for a flexible circuit 118*d* to pass under shield 116 to electrically couple with circuit board 124. In order to prevent air leaking out of shield 116, electronic device 100 further include a sealing structure 142*d* that fills a gap between shield 116 and flexible circuits 118*a*, 118*c*, and 118*d*. As a result, airflow from fan assemblies 110*a* and 110*b* (shown in FIG. 4) is less susceptible to (or prevent from) leaking through shield 116.

FIG. 8 illustrates an enlarged isometric view of electronic device 100, showing additional seals between shield 116 and fan assembly 110*b*. As shown, a gasket assembly 158 is secured with fan assembly 110*b* and shield 116. Gasket assembly 158 may provide an airtight seal between fan assembly 110*b* and shield 116. Further, gasket assembly 158 may include a conductive gasket 160*a* and a conductive gasket 160*b*. Conductive gaskets 160*a* and 160*b* may each include an electrically conductive material, and accordingly, fan assembly 110*b* can be electrically grounded to shield 116 by gasket assembly 158.

Figure 9:
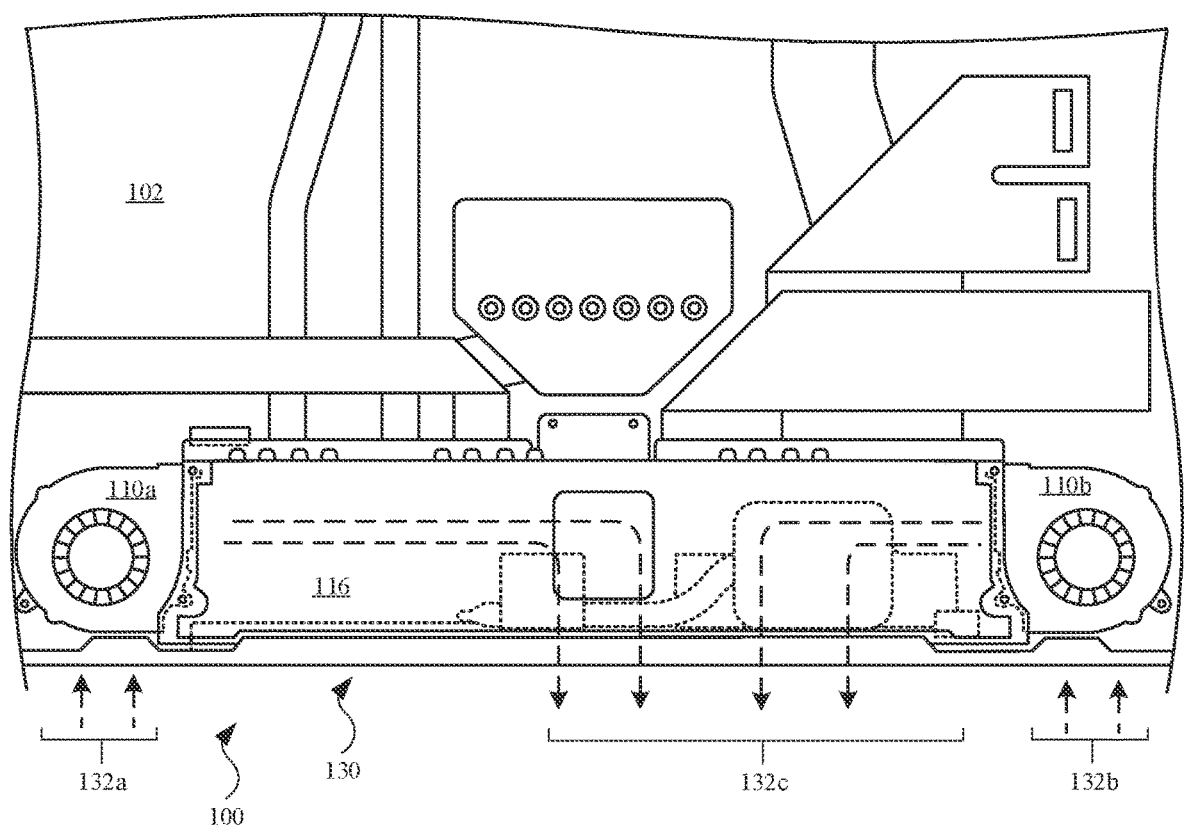
FIG. 9 illustrates a plan view of the electronic device, showing airflow from the fan assemblies passing though the electronic device.

FIG. 9 illustrates a plan view of electronic device 100, showing airflow from the fan assemblies 110*a* and 110*b* passing through electronic device 100. As shown, fan assemblies 110*a* and 110*b* drive air (represented by arrows), in the form of ambient air, into housing 102 through sections 132*a* and 132*b*, respectively, of grill 130. The air subsequently passes over circuit board 124 (shown in FIG. 4) and the thermally conductive assembly (shown in FIG. 6), such that the air convectively cools the components on circuit board 124 and thermally conductive assembly. Then, the air leaves housing 102 via section 132*c* of grill 130. The sealing structures 142*b* and 142*c* (shown in FIG. 6) can bias the components that contain a relatively high amount of thermal energy, such as integrated circuit 126 (shown in FIG. 4) and the aforementioned thermally conductive assembly. Further, the aforementioned sealing structures limit or prevent the heated air from extending to other locations of housing 102. As a result, the heated air is confined to a predetermined location (defined in part by shield 116), and efficiently passes out of housing 102.

Figure 10A:
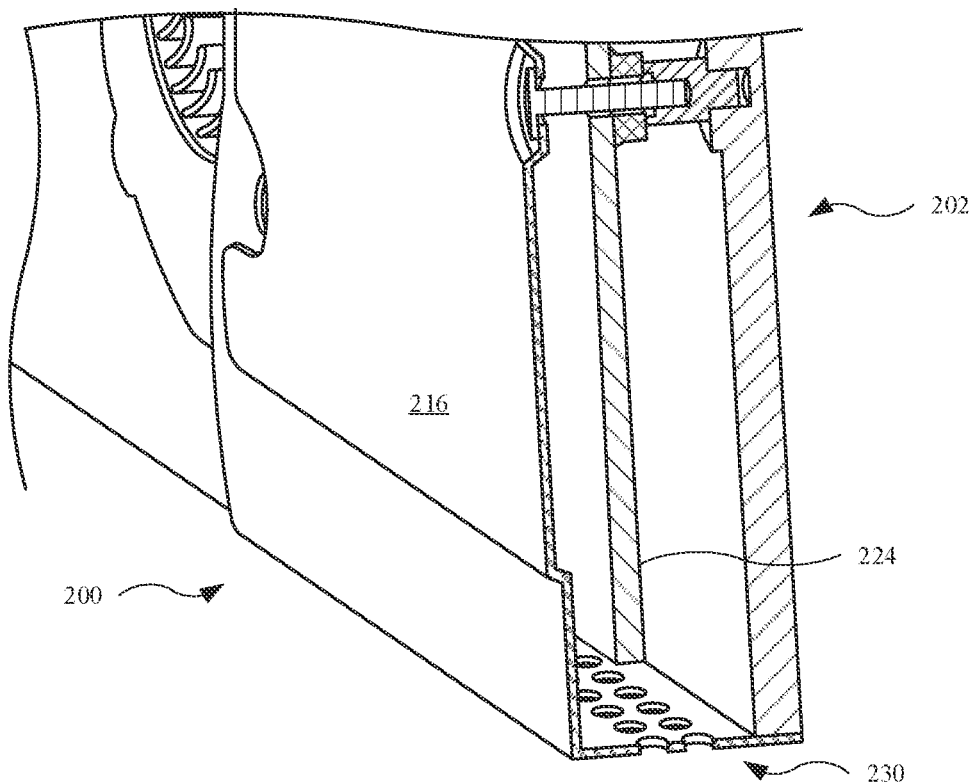
FIG. 10A illustrates an alternate embodiment of an electronic device, showing a shield modified to form a grill.

FIG. 10A illustrates an alternate embodiment of an electronic device 200, showing a shield 216 modified to form a grill 230. Electronic device 200 may include any features previously described for an electronic device. As shown, electronic device 200 includes a housing 202 and shield 216 coupled with housing 202, with shield 216 combining with housing 202 to surround a circuit board 224. Contrary to the prior embodiment, shield 216 is modified to form grill 230. In this regard, shield 216 is extended and bent to couple housing 202, with grill 230 defining several openings in shield 216. By modifying shield 216 to form grill 230, grill 230 can be formed without modifications to housing 202.

Figure 10B:
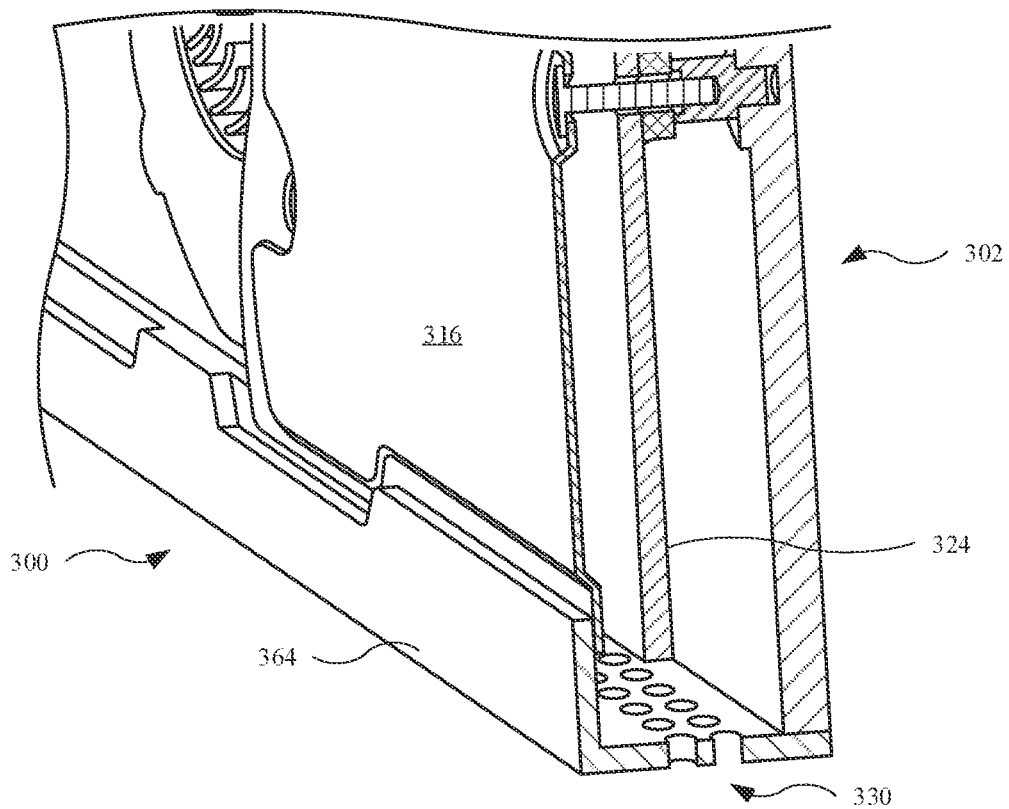
FIG. 10B illustrates an alternate embodiment of an electronic device, showing an additional structure integrated to form a grill.

FIG. 10B illustrates an alternate embodiment of an electronic device 300, showing an additional structure integrated to form a grill 330. Electronic device 300 may include any features previously described for an electronic device. As shown, electronic device 300 includes a housing 302 and a shield 316 coupled with housing 202, with shield 316 combining with housing 302 to surround a circuit board 324. Electronic device 300 may further include a plate 364 that defines a grill 330. Contrary to prior embodiments, plate 364 may define an additional structure fabricated prior to assembly independently housing 302 and shield 316. In this regard, plate 364 may decrease manufacturing times and provide a low-cost alternative.

Figure 11:
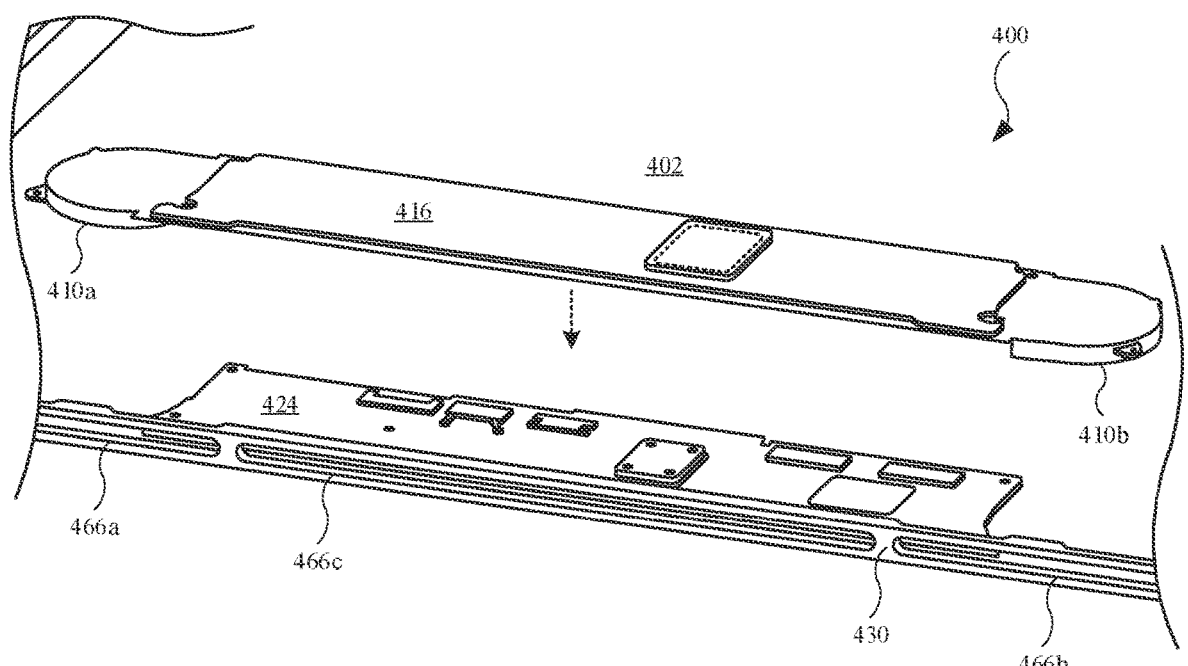
FIG. 11 illustrates an explode view of an alternate embodiment of an electronic device, showing a shield and fan assemblies integrated with the shield.

FIG. 11 illustrates an explode view of alternate embodiment of an electronic device 400, showing a shield 416 and fan assemblies integrated with shield 416. Electronic device 400 may include any features described herein for an electronic device. As shown, electronic device 400 includes a fan assembly 410*a* and a fan assembly 410*b*. Fan assemblies 410*a* and 410*b* are integrated with shield 416 as a sub-assembly that can be installed with a housing 402 of electronic device 400, and in particular, over a circuit board 424 installed in housing 402. Fan assemblies 410*a* and 410*b* may be secured with shield 416 by similar methods previously described, such as through airtight sealing structures. By integrating fan assemblies 410*a* and 410*b* with shield 416, the process for assembly may be more efficient as opposed to assembling individual parts with housing 402.

Also, housing 402 may include a grill 430 with a different pattern of openings. As shown, grill 430 includes an opening 466*a*, an opening 466*b*, and an opening 466*c*. Openings 466*a* and 466*b* may define air intake locations for fan assemblies 410*a* and 410*b*, respectively, while opening 466*c* defines an air output location.

Figure 12:
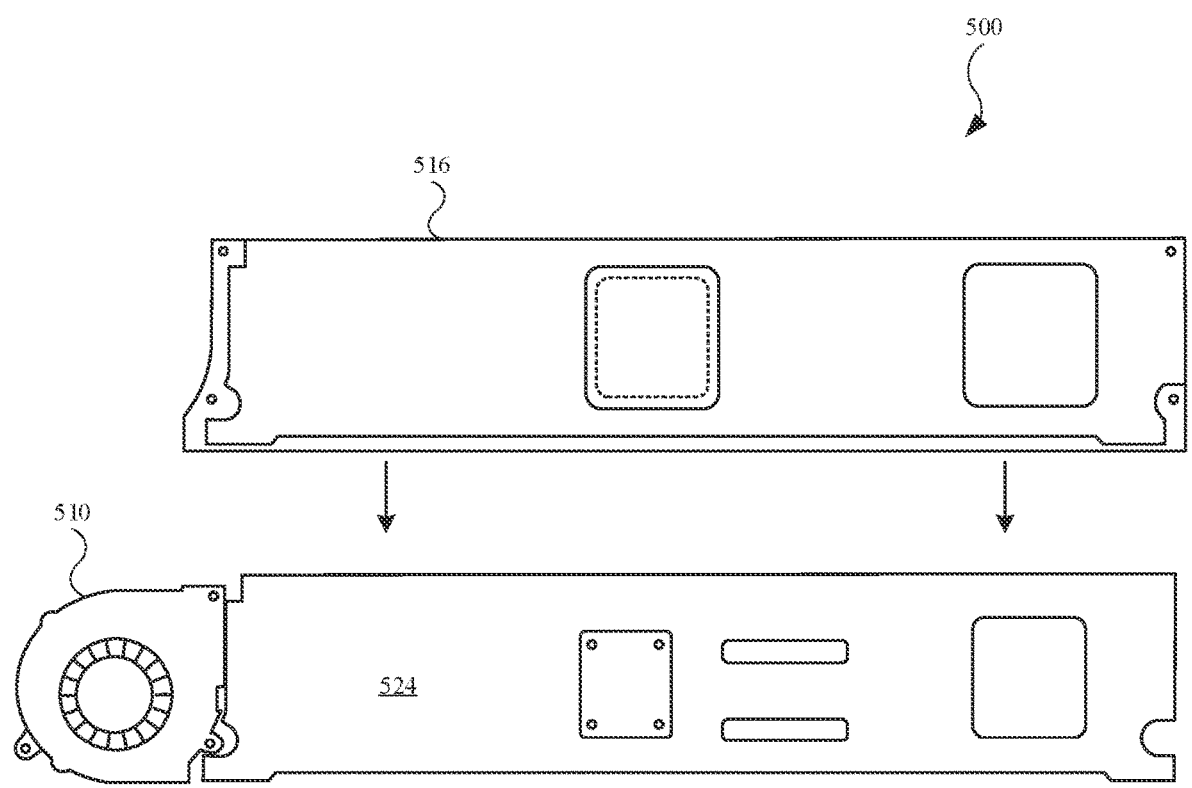
FIG. 12 illustrates a plan view of an alternate embodiment of an electronic device, showing a different number of fans used in the electronic device.

FIG. 12 illustrates a plan view of an alternate embodiment of an electronic device 500, showing a different number of fans used in electronic device 500. Although not shown, electronic device 500 may include several features previously described for an electronic device, including a housing and a display, as non-limiting examples. As shown, electronic device 500 includes a fan assembly 510, representing a single fan assembly of electronic device 500. A single fan assembly may provide several advantages. For instance, electronic device 500 may include a smaller form factor and/or fewer parts, based on fan assembly 510 being the sole fan assembly.

Fan assembly 510 may include similar features as prior embodiments of fan assemblies. For instance, fan assembly 510 may include a fan housing (not labeled). In this manner, electronic device 500 may include a shield 516 designed to cover a circuit board 524 and seal with fan assembly 510. Also, shield 516 may be modified to also seal with regions of circuit board 524 such that fan assembly 510 drives air, in a closed volume, over components (partially shown) positioned on circuit board 524.

Figure 13:
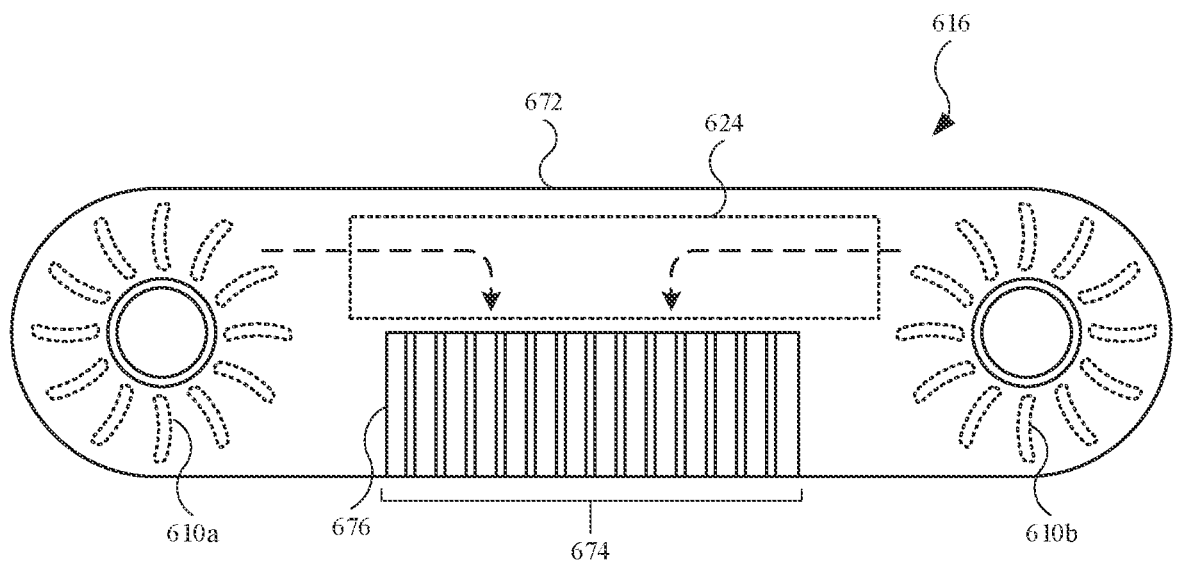
FIGS. 13 and 14 illustrate an alternate embodiment of a shield, showing multiple components integrated with the shield.
Figure 14:
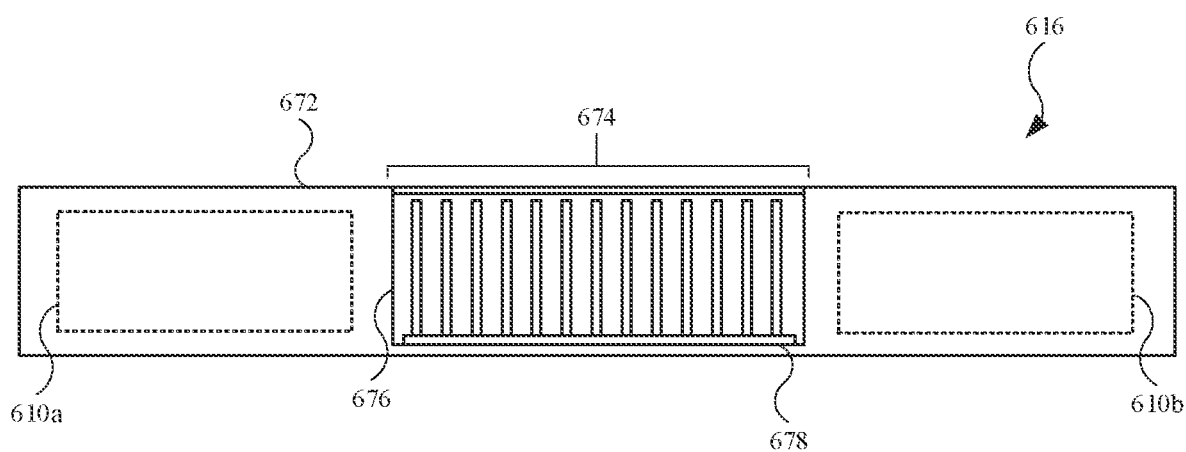

FIGS. 13 and 14 illustrate an alternate embodiment of a shield 616, showing multiple components integrated with shield 616. As shown, shield 616 includes a housing 672 in which several components are disposed. For example, housing 672 holds a fan assembly 610*a* and a fan assembly 610*b*, as well as a circuit board 624 and a thermal component 674 (positioned between fan assemblies 610*a* and 610 *b*). Thermal component 674, which may include a fin stack, is located along an opening 676 of housing 672. Fan assemblies 610*a* and 610*b*, during operation, drive ambient air into housing 672, whereby the air flows over circuit board 624 and heat-generating components (not shown) located on circuit board 624, and carries the thermal energy from aforementioned heat-generating components to thermal component 674. As shown in FIG. 13, the air (represented arrows) pass over thermal component 674. When thermal component 674 draws thermal energy from a heated body (not shown), the airflow from fan assemblies 610*a* and 610*b* convectively cool thermal component 674, thereby allowing thermal component 674 to continue to draw thermal energy from the heated body. By integrating fan assemblies 610*a* and 610*b*, as well as thermal component 674, into housing 672, the process for assembly may be more efficient as opposed to assembling individual parts with a housing of an electronic device. Additionally, FIG. 14 shows thermal component 674 coupled to housing 672 by a base 678. Base 678 may include a relatively low thermally conductive material, such as an adhesive (as a non-limiting example), that not only secures thermal component 674 with housing 672 but also provides a thermal barrier between thermal component 674 and housing 672. In particular, base 678 can prevent direct contact between thermal component 674 and housing 672. In this manner, any thermal energy received by thermal component 674 is less likely to spread into housing 672.

Similar to prior embodiments, shield 616 is positioned over circuit board 624. In this manner, while thermal component 674 can draw thermal energy from one or more integrated circuits of circuit board 624, housing 672, when formed from a metal, provides an EMI barrier, and prohibits transmission of EMI. Accordingly, shield 616 may provide compact sub-assembly that contributes to a more efficient assembly of an electronic device described herein.

Figure 15:
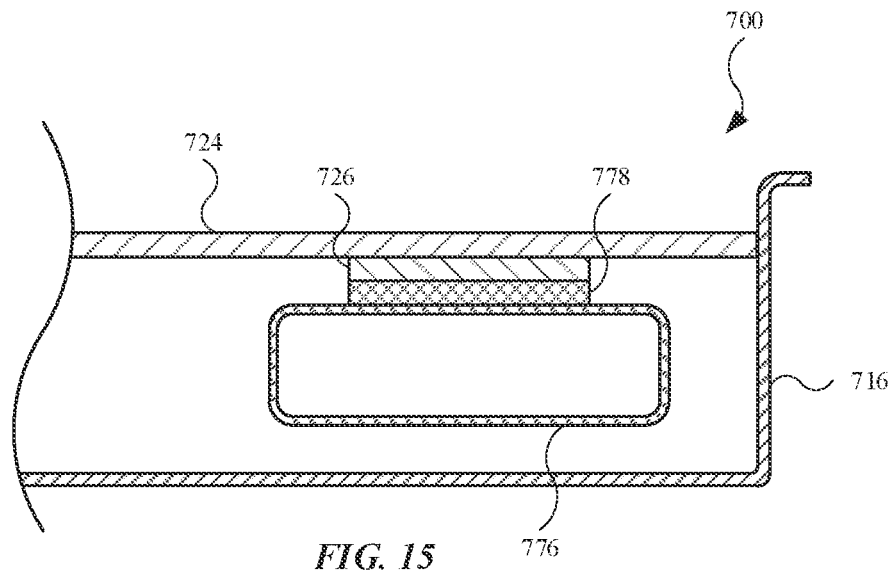
FIG. 15 illustrates an alternate embodiment of an electronic device, showing a shield and a thermal component integrated with the electronic device.

FIG. 15 illustrates an alternate embodiment of an electronic device 700, showing a shield 716 and a thermal component 776 integrated with electronic device 700. Electronic device 700 may include any features described herein for an electronic device. As shown, electronic device 700 includes a circuit board 724 covered by shield 716. Further, an integrated circuit 726 is positioned on circuit board 724, and coupled with thermal component 776. Integrated circuit 726 and thermal component 776 may be coupled by an adhesive 778, which may include a thermally conductive adhesive.

Thermal component 776 may include a heat pipe designed to draw thermal energy from integrated circuit 726. In this regard, thermal energy can be transported through thermal component 776, and in particular, an opening defined by thermal component 776. Additionally, shield 716 is positioned over, and extends lengthwise along, thermal component 776. As a result, in some instances, shield 716 can draw thermal energy from thermal component 776 through, for example, heat vapor transfer. By aligning thermal component 776 with shield 716 in this manner, the respective surface areas of shield 716 and thermal component 776 are more efficiently utilized for thermal energy transmission/dissipation. Alternatively, or in combination, a heat pipe (not shown in FIG. 15) may be integrated with electronic device 700 between thermal component 776 and shield 616 in order to improve convective heat flow from thermal component 776 to shield 716.

Figure 16:
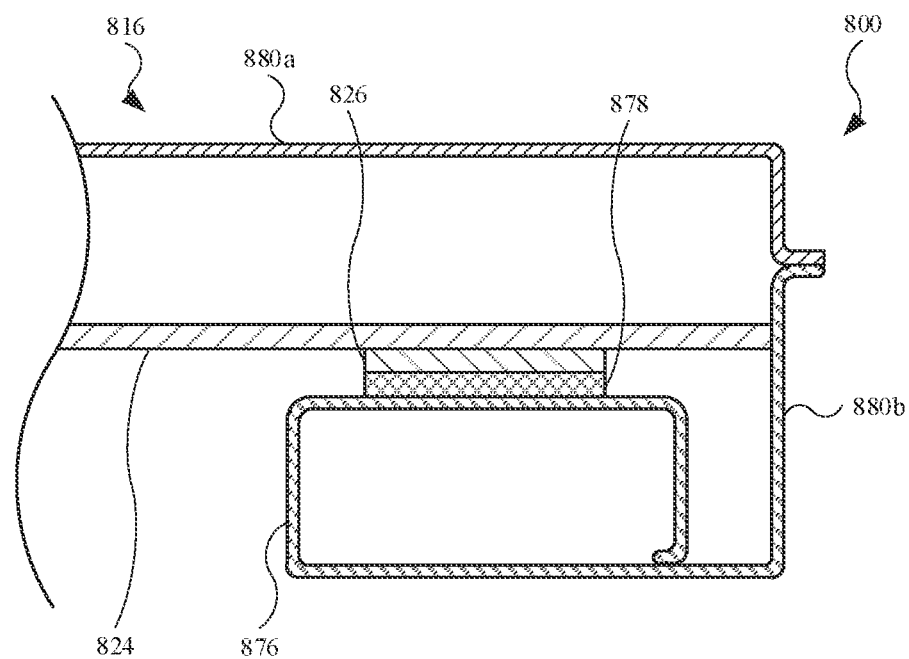
FIG. 16 illustrates an alternate embodiment of an electronic device, showing a shield modified to form a thermal component.

FIG. 16 illustrates an alternate embodiment of an electronic device 800, showing a shield 816 modified to form a thermal component 876. Electronic device 800 may include any features described herein for an electronic device. As shown, electronic device 800 includes a circuit board 824 covered by shield 816. Further, an integrated circuit 826 is positioned on circuit board 824, and coupled with thermal component 876. Integrated circuit 826 and thermal component 876 may be coupled by an adhesive 878, which may include a thermally conductive adhesive.

Unlike prior embodiments, shield 816 includes multiple shield components. As shown, shield 816 includes a shield component 880a and a shield component 880b. Further, shield component 880b forms a thermal component 876, which may include a heat pipe designed to draw thermal energy from integrated circuit 826. In this regard, thermal energy can be transported through thermal component 876. In some instances, thermal energy can be transported shield components 880a and 880b through conduction. When shield components 880a and 880b are coupled with a housing of an electronic device (not shown in FIG. 16), shield components 880a and 880b can dissipate thermal energy to the housing.

Figure 17:
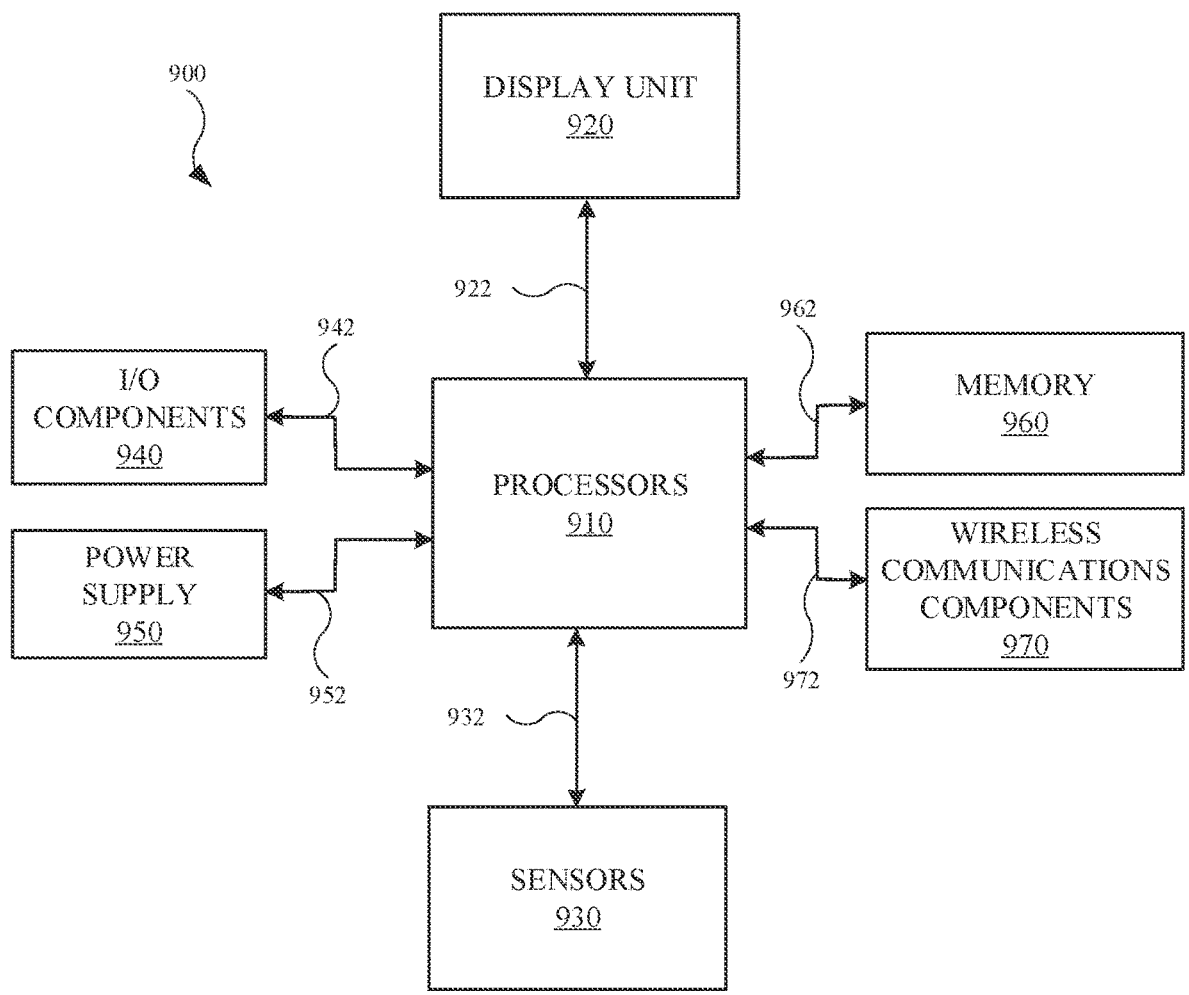
FIG. 17 illustrates a block diagram of an electronic device, in accordance with some described embodiments.

FIG. 17 illustrates a block diagram of an electronic device 900, in accordance with some described embodiments. The features in electronic device 900 may be present in other electronic devices described herein. Electronic device 900 may include one or more processors 910 for executing functions of the electronic device 900. One or more processors 910 can refer to at least one of a central processing unit (CPU) and at least one microcontroller for performing dedicated functions. Also, one or more processors 910 can refer to application specific integrated circuits.

According to some embodiments, electronic device 900 can include a display unit 920. Display unit 920 is capable of presenting a user interface that includes icons (representing software applications), textual images, and/or motion images. In some examples, each icon can be associated with a respective function that can be executed by one or more processors 910. In some cases, display unit 920 includes a display layer (not illustrated), which can include a liquid-crystal display (LCD), light-emitting diode display (LED), or the like. According to some embodiments, display unit 920 includes a touch input detection component and/or a force detection component that can be configured to detect changes in an electrical parameter (e.g., electrical capacitance value) when the user's appendage (acting as a capacitor) comes into proximity with display unit 920 (or in contact with a transparent layer that covers the display unit 920). Display unit 920 is connected to one or more processors 910 via one or more connection cables 922.

According to some embodiments, electronic device 900 can include one or more sensors 930 capable of provide an input to one or more processors 910 of electronic device 900. One or more sensors 930 may include a temperature sensor, a capacitive sensor, and magnetic field sensors, as a non-limiting example. One or more sensors 930 is/are connected to one or more processors 910 via one or more connection cables 932.

According to some embodiments, electronic device 900 can include one or more input/output components 940. In some cases, the one or more input/output components 940 can refer to a button or a switch that is capable of actuation by the user. When one or more input/output components 940 are used, one or more input/output components 940 can generate an electrical signal that is provided to one or more processors 910 via one or more connection cables 942.

According to some embodiments, electronic device 900 can include a power supply 950 that is capable of providing energy to the operational components of electronic device 900. In some examples, power supply 950 can refer to a rechargeable battery. Power supply 950 can be connected to one or more processors 910 via one or more connection cables 952. The power supply 950 can be directly connected to other devices of electronic device 900, such as one or more input/output components 940. In some examples, electronic device 900 can receive power from another power source (e.g., an external charging device).

According to some embodiments, the electronic device 900 can include memory 960, which can include a single disk or multiple disks (e.g., hard drives), and includes a storage management module that manages one or more partitions within memory 960. In some cases, memory 960 can include flash memory, semiconductor (solid state) memory or the like. Memory 960 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 900. In some embodiments, memory 960 refers to a non-transitory computer readable medium. One or more processors 910 can also be used to execute software applications. In some embodiments, a data bus 962 can facilitate data transfer between memory 960 and one or more processors 910.

According to some embodiments, electronic device 900 can include wireless communications components 970. A network/bus interface 972 can couple wireless communications components 970 to one or more processors 910. Wireless communications components 970 can communicate with other electronic devices via any number of wireless communication protocols, including at least one of a global network (e.g., the Internet), a wide area network, a local area network, a wireless personal area network (WPAN), or the like. In some examples, the wireless communications components 970 can communicate using NFC protocol, BLUETOOTH® protocol, or WIFI® protocol.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
a display;
a housing coupled with the display, the housing defining an internal volume and a grill with openings formed in a sidewall of the housing, wherein the openings define:
a first air intake section,
a second air intake section separate from the first air intake section, and
an air output section separate from the first air intake section and the second air intake section; and
components disposed within the internal volume, the components comprising:
a first fan assembly comprising a first fan housing,
a second fan assembly comprising a second fan housing,
a circuit board comprising an integrated circuit, and
a shield covering the circuit board and coupled between the first fan housing and the second fan housing, wherein the shield i) blocks electromagnetic interference from the integrated circuit and ii) directs airflow from the first fan assembly and the second fan assembly through the first air intake section and the second air intake section, respectively, and to the air output section.

2. The electronic device of claim 1, further comprising:
a first sealing structure adhered to at least one of the first fan housing or the shield; and
a second sealing structure adhered to at least one of the second fan housing or the shield.

3. The electronic device of claim 2, wherein the first sealing structure and the second sealing structure define a first airtight seal and a second airtight seal, respectively.

4. The electronic device of claim 1, further comprising a sealing structure that partially covers the grill, thereby defining a covered section and an uncovered section of the grill, wherein the airflow is directed through the grill at the uncovered section, and the airflow is blocked from passing through the grill at the covered section.

5. The electronic device of claim 4, further comprising a thermally conductive assembly disposed within the internal volume, wherein the thermally conductive assembly is i) positioned between the integrated circuit and a housing wall of the housing, and ii) aligned with the uncovered section.

6. The electronic device of claim 5, further comprising a standoff that separates the circuit board from the housing wall, wherein:
the circuit board comprises a first surface and a second surface opposite the first surface, and
the airflow from the first fan assembly and the second fan assembly passes over the first surface, the second surface, and the thermally conductive assembly.

7. The electronic device of claim 1,
wherein the air output section is positioned between the first air intake section and the second air intake section.

8. An electronic device, comprising:
a display;
a housing coupled with the display, the housing defining an internal volume and a grill that defines openings;
a first sealing structure that covers a first portion of the openings;
a second sealing structure that covers a second portion of the openings, wherein the openings define a first air intake section, a second air intake section separate from the first air intake section, and an air output section separate from the first air intake section and the second air intake section; and
components disposed within the internal volume, the components comprising:
a first fan assembly configured to receive air from the first air intake section, the first fan assembly comprising a first fan housing,
a second fan assembly configured to receive air from the second air intake section, the second fan assembly comprising a second fan housing, and a shield coupled between the first fan housing and the second fan housing, wherein the shield is configured to block electromagnetic interference and directs airflow from the first fan assembly and the second fan assembly through the first and second air intake sections respectively and output through the air output section.

9. The electronic device of claim 8, further comprising:
a circuit board positioned between the shield and the housing; and
an integrated circuit positioned on the circuit board, wherein the shield is configured to block the electromagnetic interference from reaching the integrated circuit.

10. The electronic device of claim 9, further comprising a flexible circuit connected with the display and the circuit board, wherein the shield defines an indentation, and the flexible circuit passes through the shield at the indentation.

11. The electronic device of claim 10, a sealing structure secured with the flexible circuit and the shield at the indentation.

12. The electronic device of claim 8, further comprising:
a third sealing structure that seals the first fan housing with the shield,
a fourth sealing structure that seals the second fan housing with the shield.

13. The electronic device of claim 12, wherein the first sealing structure, the second sealing structure, the third sealing structure, and the fourth sealing structure define a first airtight seal, a second airtight seal, a third airtight seal, and a fourth airtight seal, respectively.

14. The electronic device of claim 8, further comprising a heat sink aligned with the air output section.

15. An electronic device, comprising:
a display;
a housing coupled with the display, the housing defining an internal volume and a grill with openings that defines a first air intake section and a second air intake section; and
components disposed within the internal volume, the components comprising:
a first fan assembly configured to receive air from opening on the first air intake section, the first fan assembly comprising a first fan assembly housing,
a second fan assembly configured to receive air from opening on the second air intake section, the second fan assembly comprising a second fan assembly housing,
a circuit board positioned between the first fan assembly and the second fan assembly,
a shield configured to block electromagnetic interference from the circuit board and coupled with the first fan assembly housing and the second fan assembly housing, the shield defining an indentation,
a flexible circuit connected with the display and the circuit board, wherein the flexible circuit passes through the shield at the indentation, and
a sealing structure secured with the flexible circuit and the shield at the indentation,
wherein the sealing structure covers at least some of the openings to define the first air intake section, the second air intake section, and an air output section.

16. The electronic device of claim 15, further comprising an integrated circuit located on the circuit board, wherein the shield protects the integrated circuit from electromagnetic interference.

17. The electronic device of claim 16, wherein the shield directs airflow from the first fan assembly and the second fan assembly through the grill.

18. The electronic device of claim 15, further comprising:
a first sealing structure that covers a first portion of the grill; and
a second sealing structure that covers a second portion of the grill.

19. The electronic device of claim 18, wherein the first sealing structure and the second sealing structure define the first air intake section, the second air intake section, and the air output section.

20. The electronic device of claim 19, wherein the shield directs airflow from the first fan assembly and the second fan assembly through the air output section.

* * * * *